(12) United States Patent
Fujita et al.

(10) Patent No.: US 9,905,341 B2
(45) Date of Patent: Feb. 27, 2018

(54) METAL NITRIDE MATERIAL FOR THERMISTOR, METHOD FOR PRODUCING SAME, AND FILM TYPE THERMISTOR SENSOR

(71) Applicant: MITSUBISHI MATERIALS CORPORATION, Tokyo (JP)

(72) Inventors: Toshiaki Fujita, Naka (JP); Hiroshi Tanaka, Naka (JP); Hitoshi Inaba, Nakia (JP); Kazutaka Fujiwara, Naka (JP); Noriaki Nagatomo, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 480 days.

(21) Appl. No.: 14/380,997

(22) PCT Filed: Feb. 26, 2013

(86) PCT No.: PCT/JP2013/055769
§ 371 (c)(1),
(2) Date: Aug. 26, 2014

(87) PCT Pub. No.: WO2013/129680
PCT Pub. Date: Sep. 6, 2013

(65) Prior Publication Data
US 2015/0036723 A1 Feb. 5, 2015

(30) Foreign Application Priority Data

Feb. 28, 2012 (JP) .................................. 2012-041966

(51) Int. Cl.
G01K 7/00 (2006.01)
H01C 7/00 (2006.01)
(Continued)

(52) U.S. Cl.
CPC .............. *H01C 7/008* (2013.01); *C30B 25/06* (2013.01); *C30B 29/38* (2013.01); *G01K 7/22* (2013.01);
(Continued)

(58) Field of Classification Search
None
See application file for complete search history.

(56) References Cited

U.S. PATENT DOCUMENTS 5,330,853 A * 7/1994 Hofmann ............ C23C 14/0084
407/117
2003/0219633 A1* 11/2003 Sulin ...................... B23B 27/148
428/698
(Continued)

FOREIGN PATENT DOCUMENTS

DE 3207979 A1 9/1983
JP S6396262 A 4/1988
(Continued)

OTHER PUBLICATIONS

XP-002752445—Japanese Patent Application No. JP 19700118037 (19701222), Abstract only.
(Continued)

*Primary Examiner* — Erica Lin
(74) *Attorney, Agent, or Firm* — Locke Lord LLP

(57) ABSTRACT

Provided are a metal nitride material for a thermistor, which exhibits high reliability and high heat resistance and can be directly deposited on a film or the like without firing, a method for producing the metal nitride material for a thermistor, and a film type thermistor sensor. The metal nitride material for a thermistor consists of a metal nitride represented by the general formula: $Ti_xAl_yN_z$ (where $0.70 \leq y/(x+y) \leq 0.95$, $0.4 \leq z \leq 0.5$, and $x+y+z=1$), and the crystal structure thereof is a hexagonal wurtzite-type single phase.

15 Claims, 7 Drawing Sheets

(51) Int. Cl.
  *H01C 7/04* (2006.01)
  *C30B 25/06* (2006.01)
  *C30B 29/38* (2006.01)
  *G01K 7/22* (2006.01)
  *H01C 17/12* (2006.01)
  *H01C 7/02* (2006.01)

(52) U.S. Cl.
  CPC .............. *H01C 7/04* (2013.01); *H01C 7/043* (2013.01); *H01C 17/12* (2013.01); *H01C 7/023* (2013.01)

(56) References Cited

U.S. PATENT DOCUMENTS

| | | | | |
|---|---|---|---|---|
| 2004/0089807 | A1* | 5/2004 | Wada | G01J 5/20 250/338.1 |
| 2011/0081539 | A1* | 4/2011 | Ni | C23C 14/0641 428/328 |

FOREIGN PATENT DOCUMENTS

| | | | |
|---|---|---|---|
| JP | H0590011 | A | 4/1993 |
| JP | H06158272 | A | 6/1994 |
| JP | 2004319737 | A * | 11/2004 |
| JP | 2004319737 | A | 11/2004 |
| WO | WO2003085152 | * | 10/2003 |

OTHER PUBLICATIONS

XP-002752444—Japanese Patent Application No. JP 19700130060, Abstract only.
Extended European Search Report dated Jan. 11, 2016, issued on corresponding European Patent application No. 13754162.9.
International Search Report of PCT/JP2013/055769 dated Jun. 4, 2013.

* cited by examiner

METAL NITRIDE MATERIAL FOR THERMISTOR, METHOD FOR PRODUCING SAME, AND FILM TYPE THERMISTOR SENSOR

CROSS-REFERENCE TO RELATED APPLICATIONS

This application is the national phase under 35 U.S.C. § 371 of PCT International Application No. PCT/JP2013/055769, filed Feb. 26, 2013, which claims the benefit of Japanese Patent Application No. 2012-041966 filed Feb. 28, 2012, the entire contents of the aforementioned applications are hereby incorporated herein by reference.

BACKGROUND OF THE INVENTION

Field of the Invention

The present invention relates to a metal nitride material for a thermistor, which can be directly deposited on a film or the like without firing, a method for producing the same, and a film type thermistor sensor.

Description of the Related Art

There is a requirement for a thermistor material used for a temperature sensor or the like to exhibit a high B constant so as to obtain a high precision and high sensitivity thermistor sensor. Conventionally, transition metal oxides such as Mn, Co, Fe, and the like are typically used as such thermistor materials (see Patent Documents 1 and 2). These thermistor materials need to be fired at a temperature of 600° C. or greater in order to obtain, a stable thermistor characteristic.

In addition to thermistor materials consisting of metal oxides as described above, Patent Document 3 discloses a thermistor material consisting of a nitride represented by the general formula: $M_xA_yN_z$ (where M represents at least one of Ta, Nb, Cr, Ti, and Zr, A represents at least one of Al, Si, and B, $0.1 \leq x \leq 0.8$, $0 < y \leq 0.6$, $0.1 \leq z \leq 0.8$, and $x+y+z=1$). In Patent Document 3, only a Ta—Al—N-based material represented by $M_xA_yN_z$ (where $0.5 \leq x \leq 0.8$, $0.1 \leq y \leq 0.5$, $0.2 \leq z \leq 0.7$, and $x+y+z=1$) is described in Example. The Ta—Al—N-based material is produced by sputtering in a nitrogen gas-containing atmosphere using a material containing the elements as set forth as a target. The obtained thin film is subject to a heat treatment, at a temperature from 350 to 600° C. as required.

PRIOR ART DOCUMENTS

Patent Documents

[Patent Document 1] Japanese Unexamined Patent Application Publication No. 2003-226573
[Patent Document 2] Japanese Unexamined Patent Application Publication No. 2006-324520
[Patent Document 3] Japanese Unexamined Patent Application Publication No. 2004-319737

SUMMARY OF THE INVENTION

Problems to be Solved by the Invention

The following problems still remain in the conventional techniques described above.

In recent years, the development of a film type thermistor sensor made of a thermistor material on a resin film has been considered, and thus, it has been desired, to develop a thermistor material which can be directly deposited on a film. Specifically, it is expected to obtain a flexible thermistor sensor by using a film. Furthermore, although it is desired to develop a very thin thermistor sensor having a thickness of about 0.1 mm, a substrate material using a ceramics material such as alumina has often conventionally used. For example, if the substrate material is thinned to a thickness of 0.1 mm, the substrate material is very fragile and easily breakable. Thus, it is expected to obtain a very thin thermistor sensor by using a film.

However, a film made of a resin material typically has a low heat resistance temperature of 150° C. or lower, and even polyimide which is known as a material relatively having a high heat resistance temperature only has a heat resistance temperature of about 200° C. Hence, when a heat treatment is performed in steps of forming a thermistor material, it has been conventionally difficult to use such a thermistor material. The above conventional oxide thermistor material needs to be fired at a temperature of 600° C. or higher in order to realize a desired thermistor characteristic, so that a film type thermistor sensor which is directly deposited on a film cannot be realized. Thus, it has been desired to develop a thermistor material which can be directly deposited on a film without firing. However, even in the thermistor material disclosed in Patent Document 3, there has remained the need to perform a heat treatment for the obtained thin film at a temperature from 350 to 600° C. as required in order to obtain a desired thermistor characteristic. As the thermistor material, although a material having a B constant of about 500 to 3000 K was obtained in Example of a Ta—Al—N-based material, there is no description regarding heat resistance, and thus, the thermal reliability of a nitride-based material has been unknown.

The present invention has been made in view of the aforementioned circumstances, and an object of the present invention is to provide a metal nitride material for a thermistor, which exhibits high reliability and high heat resistance and can be directly deposited on a film or the like without firing, a method for producing the metal nitride material for a thermistor, and a film type thermistor sensor.

Means for Solving the Problems

The present inventors' serious endeavor by focusing on an AlN-based material among nitride materials found that the AlN-based material having a good B constant and exhibiting excellent heat resistance may be obtained without firing by substituting Al-site with a specific metal element for improving electric conductivity and by ordering it into a specific crystal structure because AlN is an insulator and it is difficult for AlN to obtain an optimum thermistor characteristic (B constant: about 1000 to 6000 K).

Thus, the present invention has been obtained on the basis of the above finding and adopts the following structure in order to solve the aforementioned problems.

Specifically, a metal nitride material for a thermistor according to a first aspect of the present invention is characterized in that the metal nitride material for a thermistor is a metal nitride material for a thermistor, which consists of a metal nitride represented by the general formula: $Ti_xAl_yN_z$ (where $0.70 \leq y/(x+y) \leq 0.95$, $0.4 \leq z \leq 0.5$, and $x+y+z=1$), wherein the crystal structure thereof is a hexagonal wurtzite-type single phase.

Since the metal nitride material for a thermistor consists of a metal nitride represented by the general formula: $Ti_xAl_yN_z$ (where $0.70 \leq y/(x+y) \leq 0.95$, $0.4 \leq z \leq 0.5$, and $x+y+z=1$), wherein the crystal structure thereof is a hexagonal wurtzite-type single phase, the metal nitride material having a good B constant and exhibiting excellent heat resistance may be obtained without firing.

Note that, when the value "y/(x+y)" (i.e., Al/(Ti+Al)) is less than 0.70, a wurtzite-type single phase is not obtained but two coexist phases of a wurtzite-type phase and a NaCl-type phase or a single phase of only a NaCl-type phase may be obtained, so that a sufficiently high resistance and a high B constant cannot be obtained.

When the ratio of "y/(x+y)" (i.e., Al/(Ti+Al)) exceeds 0.95, the metal nitride material exhibits very high resistivity and extremely high electrical insulation, so that the metal nitride material is not applicable as a thermistor material.

When the ratio of "z" (i.e., N/(Ti+Al+N)) is less than 0.4, the amount of nitrogen contained in the metal is small, so that a wurtzite-type single phase cannot be obtained. Consequently, a sufficiently high resistance and a high B constant cannot be obtained.

Furthermore, when the ratio of "z" (i.e., N/(Ti+Al+N)) exceeds 0.5, a wurtzite-type single phase cannot be obtained. This is because a stoichiometric ratio of N/(Ti+Al+N) in a wurtzite-type single phase when there is no defect at nitrogen-site is 0.5.

A metal nitride material for a thermistor according to a second aspect of the present invention is characterized in that the metal nitride material for a thermistor according to the first aspect of the present invention is deposited as a film and is a columnar crystal extending in a vertical direction to the surface of the film.

Specifically, since the metal nitride material for a thermistor is a columnar crystal extending in a vertical direction to the surface of the film, the crystallinity of the film is high, resulting in obtaining high heat resistance.

A metal nitride material for a thermistor according to a third aspect of the present invention is characterized in that the metal nitride material according to the first or the second aspect of the present invention is deposited as a film and is strongly oriented along a c-axis more than an a-axis in a vertical direction to the surface of the film.

Specifically, since the metal nitride material for a thermistor is strongly oriented along the c-axis more than the a-axis in a vertical direction to the surface of the film, the metal nitride material having a high B constant as compared with the case of a strong a-axis orientation and excellent reliability in heat resistance is obtained.

A film type thermistor sensor according to a fourth aspect of the present invention is characterized in that the film type thermistor sensor includes an insulating film; a thin film thermistor portion made of the metal nitride material for a thermistor according to any one of the first to third aspects of the present invention on the insulating film; and a pair of pattern electrodes formed at least on the top or the bottom of the thin film thermistor portion.

Specifically, since, in the film type thermistor sensor, a thin film thermistor portion made of the metal nitride material for a thermistor according to any one of the first to third aspects of the present invention is formed on the insulating film, an insulating film having low heat resistance, such as a resin film, may be used by the presence of the thin film thermistor portion which is formed without firing and has a high B constant and high heat resistance, so that a thin and flexible thermistor sensor having an excellent thermistor characteristic is obtained.

A substrate material using a ceramics material such as alumina has often conventionally used. For example, if the substrate material is thinned to a thickness of 0.1 mm, the substrate material is very fragile and easily breakable. In the present invention, a film may be used, so that a very thin film type thermistor sensor having a thickness of 0.1 mm can be obtained.

A method for producing a metal nitride material for a thermistor according to a fifth aspect of the present invention is characterized in that the method for producing the metal nitride material for a thermistor according to any one of the first to third aspects of the present invention includes a depositing step of performing film deposition by reactive sputtering in a nitrogen-containing atmosphere using a Ti—Al alloy sputtering target.

Specifically, since, in the method for producing the metal nitride material for a thermistor, film deposition is performed by reactive sputtering in a nitrogen-containing atmosphere using a Ti—Al alloy sputtering target, the metal nitride material for a thermistor of the present invention, which consists of the aforementioned TiAlN, can be deposited on a film without firing.

A method for producing a metal nitride material for a thermistor according to a sixth aspect of the present invention is characterized in that, in the method according to the fifth aspect of the present invention, a sputtering gas pressure during the reactive sputtering is set to less than 0.67 Pa.

Specifically, since, in the method for producing a metal nitride material for a thermistor, a sputtering gas pressure during the reactive sputtering is set to less than 0.67 Pa, the film made of the metal nitride material for a thermistor according to the third aspect of the present invention, which is strongly oriented along the c-axis more than the a-axis in a vertical direction to the surface of the film, can be formed.

A method for producing a metal nitride material for a thermistor according to a seventh aspect of the present invention is characterized in that the method according to the fifth, or sixth aspect of the present invention includes a step of irradiating the formed film with nitrogen plasma after the depositing step.

Specifically, since, in the method for producing a metal nitride material for a thermistor, the formed film is irradiated with nitrogen plasma after the depositing step, the nitrogen defects in the film are reduced, resulting in a further improvement in heat resistance.

Effects of the Invention

According to the present invention, the following effects may be provided.

Specifically, since the metal nitride material for a thermistor according to the present invention consists of a metal nitride represented by the general formula: $Ti_xAl_yN_z$ (where $0.70 \leq y/(x+y) \leq 0.95$, $0.4 \leq z \leq 0.5$, and $x+y+z=1$), wherein the crystal structure thereof is a hexagonal wurtzite-type single phase, the metal nitride material having a good B constant and exhibiting excellent heat resistance may be obtained without firing. Also, since, in the method for producing the metal nitride material for a thermistor according to the present embodiment, film deposition is performed by reactive sputtering in a nitrogen-containing atmosphere using a Ti—Al alloy sputtering target, the metal nitride material for a thermistor of the present invention, which consists of the aforementioned TiAlN, can be deposited on a film without firing. Furthermore, since, in the film type thermistor sensor according to the present invention, a thin film thermistor portion made of the metal nitride material for a thermistor according to the present invention is formed on an insulating film, a thin and flexible thermistor sensor having an excellent thermistor characteristic is obtained by using an insulating film having low heat resistance, such as a resin film.

Furthermore, since a substrate material is not a ceramics material which becomes very fragile and easily breakable when being thinned but a resin film, a very thin film, type thermistor sensor having a thickness of 0.1 mm is obtained.

BEST MODES FOR CARRYING OUT THE INVENTION

Figure 2:
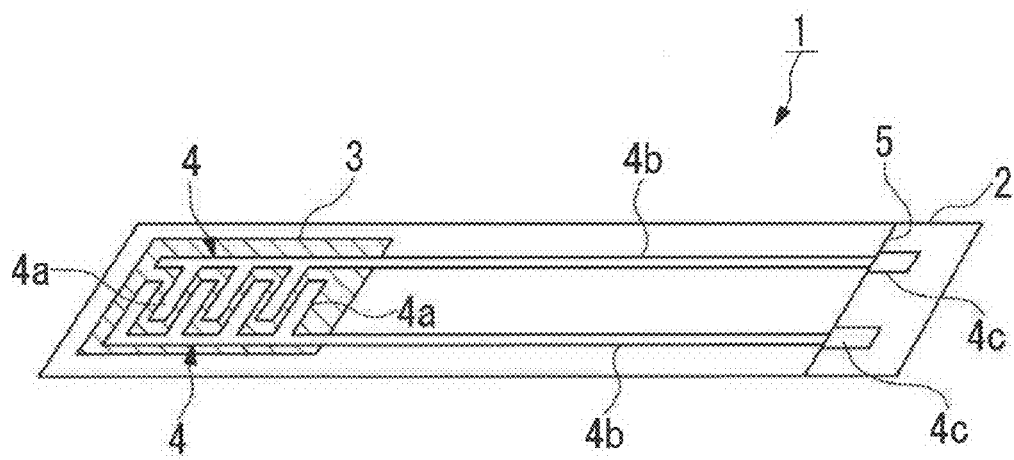
FIG. 2 is a perspective view illustrating a film type thermistor sensor according to the present embodiment.
Figure 3:
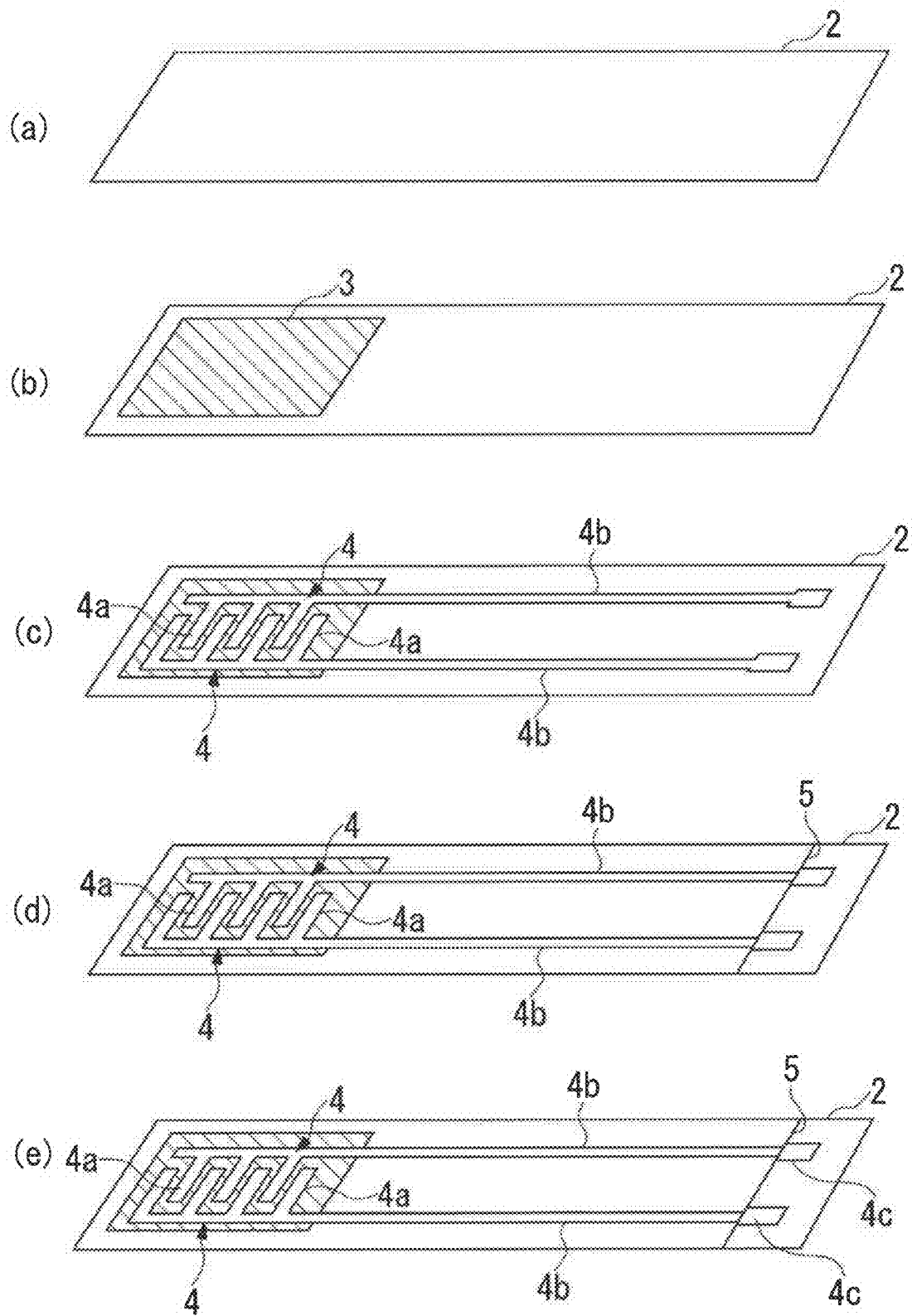
FIG. 3 is a perspective view illustrating a method for producing a film type thermistor sensor in the order of steps according to the present embodiment.

Hereinafter, a description will be given of a metal nitride material for a thermistor, a method for producing the same, and a film type thermistor sensor according to one embodiment of the present invention with reference to FIGS. 1 to 3. In the drawings used in the following description, the scale of each component is changed as appropriate so that each component is recognizable or is readily recognized.

The metal nitride material for a thermistor of the present embodiment is a metal nitride material for a thermistor consisting of a metal nitride represented by the general formula: $Ti_xAl_yN_z$ (where $0.70 \leq y/(x+y) \leq 0.95$, $0.4 \leq z \leq 0.5$, and $x+y+z=1$), wherein the crystal structure thereof is a wurtzite-type (space group $P6_3mc$ (No. 186)) single phase having a hexagonal crystal system. Specifically, the metal nitride material for a thermistor has a composition within the region enclosed by the points A, B, C, and D in the Ti—Al—N-based ternary phase diagram as shown in FIG. 1, wherein the crystal phase thereof is a wurtzite-type metal nitride.

Note that the composition ratios (x, y, z) at the points A, B, C, and D are A (15, 35, 50), B (2.5, 47.5, 50), C (3, 57, 40), and D (18, 42, 40), respectively.

Also, the metal nitride material for a thermistor is deposited as a film and is a columnar crystal extending in a vertical direction to the surface of the film. Furthermore, it is preferable that the metal nitride material for a thermistor is strongly oriented along the c-axis more than the a-axis in a vertical direction to the surface of the film.

Note that the decision on whether the metal nitride material for a thermistor has a strong a-axis orientation (100) or a strong c-axis orientation (002) in a vertical direction to the surface of the film is determined whether the peak intensity ratio of "the peak intensity of (100)"/"the peak intensity of (002)" is less than 1 by examining the orientation of crystal axis using X-ray diffraction (XRD), where (100) is the hkl index indicating a-axis orientation and (002) is the hkl index indicating c-axis orientation.

Next, a description will be given of a film type thermistor sensor using the metal nitride material for a thermistor of the present embodiment. As shown in FIG. 2, a film type thermistor sensor 1 includes an insulating film 2, a thin film thermistor portion 3 made of the metal nitride material for a thermistor on the insulating film, and a pair of pattern electrodes 4 formed at least on the thin film thermistor portion 3.

The insulating film 2 is, for example, a polyimide resin sheet formed in a band shape. Other examples of the insulating film 2 include polyethylene terephthalate (PET), polyethylene naphthalate (PEN), and the like.

The pair of pattern electrodes 4 is patterned by using stacked metal films of, for example, a Cr film and an Au film, and has a pair of comb shaped electrode portions 4a which is arranged in opposing relation to each other in a comb shaped pattern and a pair of linear extending portions 4b in which the distal ends thereof are connected to these comb shaped electrode portions 4a and the proximal ends thereof are arranged extending toward the end of the insulating film 2.

A plating portion 4c such as Au plating is formed as a lead wire drawing portion on the proximal end of each of the pair of linear extending portions 4b. One end of the lead wire is joined with the plating portion 4c via a solder material or the like. Furthermore, a polyimide coverlay film 5 is pressure bonded onto the insulating film 2 except for the end of the insulating film 2 including the plating portions 4c. Instead of the polyimide coverlay film 5, a polyimide or epoxy-based resin material may also be formed onto the insulating film 2 by printing.

A description will be given below of the method for producing a metal nitride material for a thermistor and a method for producing the film type thermistor sensor 1 using the metal nitride material for a thermistor with reference to FIG. 3.

Firstly, the method for producing a metal nitride material for a thermistor according to the present embodiment includes a depositing step of performing film deposition by reactive sputtering in a nitrogen-containing atmosphere using a Ti—Al alloy sputtering target.

It is preferable that a sputtering gas pressure during the reactive sputtering is set to less than 0.67 Pa.

Furthermore, it is preferable that the formed film is irradiated with nitrogen plasma after the depositing step.

More specifically, the thin film thermistor portion 3 having a thickness of 200 nm, which is made of the metal nitride material for a thermistor of the present embodiment, is deposited on the insulating film 2 which is a polyimide film having a thickness of 50 μm shown in FIG. 3(a) by the reactive sputtering method as shown in FIG. 3(b). The sputtering conditions at this time are as follows: an ultimate degree of vacuum: $5\times10^{-6}$ Pa, a sputtering gas pressure: 0.4 Pa, a target input power (output): 200 W, and a nitrogen gas partial pressure under a mixed gas (Ar gas+nitrogen gas) atmosphere: 20%. The metal nitride material for a thermistor having a desired size is deposited on the insulating film 2 using a metal mask so as to form the thin film thermistor portion 3. It is preferable that the formed thin film thermistor portion 3 is irradiated with nitrogen plasma. For example, the thin film thermistor portion 3 is irradiated with nitrogen plasma under the degree of vacuum of 6.7 Pa, the output of 200 W, and the $N_2$ gas atmosphere.

Next, a Cr film having a thickness of 20 nm is formed and an Au film having a thickness of 200 nm is further formed thereon by the sputtering method. Furthermore, a resist solution is coated on the stacked metal films using a bar-coater, and then prebaking is performed for 1.5 minutes at a temperature of 110° C. After being exposed by an exposure device, unnecessary portion is removed by a developing solution, and then pattering is performed by post baking for 5 minutes at a temperature of 150° C. Then, an unnecessary electrode portion is subject to wet etching using commercially available Au etchant and Cr etchant, and then the resist is stripped as shown in FIG. 3(c) so as to form a pair of the pattern electrodes 4 each having a desired comb shaped electrode portion 4a. Note that the pattern electrodes 4 may be formed in advance on the insulating film 2, and then the thin film thermistor portion 3 may be deposited on the comb shaped electrode portions 4a. In this case, the comb shaped electrode portions 4a of the pattern electrodes 4 are formed below the thin film thermistor portion 3.

Next, as shown in FIG. 3(d), for example, the polyimide coverlay film 5 with an adhesive having a thickness of 50 μm is placed onto the insulating film 2, and then bonded to each other under pressurization of 2 MPa at a temperature of 150° C. for 10 minutes using a press machine. Furthermore, as shown in FIG. 3(e), an Au thin film having a thickness of 2 μm is formed at the proximal ends of the linear extending portions 4b using an Au plating solution so as to form the plating portions 4c.

When a plurality of film type thermistor sensors 1 is simultaneously produced, a plurality of thin film thermistor portions 3 and a plurality of pattern electrodes 4 are formed on a large-format sheet of the insulating film 2 as described above, and then, the resulting large-format sheet is cut into a plurality of segments so as to obtain a plurality of film type thermistor sensors 1.

In this manner, a thin film type thermistor sensor 1 having a size of 25×3.6 mm and a thickness of 0.1 mm is obtained.

As described above, since the metal nitride material for a thermistor of the present embodiment consists of a metal nitride represented by the general formula: $Ti_xAl_yN_z$ (where $0.70 \leq y/(x+y) \leq 0.95$, $0.4 \leq z \leq 0.5$, and $x+y+z=1$), wherein the crystal structure thereof is a wurtzite-type single phase having a hexagonal crystal system, the metal nitride material having a good B constant and exhibiting excellent heat resistance may be obtained without firing.

Since the metal nitride material for a thermistor is a columnar crystal extending in a vertical direction to the surface of the film, the crystallinity of the film is high, resulting in obtaining high heat resistance.

Furthermore, since the metal nitride material for a thermistor is strongly oriented along the c-axis more than the a-axis in a vertical direction to the surface of the film, the metal nitride material having a high B constant as compared with the case of a strong a-axis orientation is obtained.

Since, in the method for producing the metal nitride material for a thermistor of the present embodiment, film deposition is performed by reactive sputtering in a nitrogen-containing atmosphere using a Ti—Al alloy sputtering target, the metal nitride material for a thermistor, which consists of the aforementioned TiAlN, can be deposited on a film without firing.

Since a sputtering gas pressure during the reactive sputtering is set to less than 0.67 Pa, the film made of the metal nitride material for a thermistor, which is strongly oriented along the c-axis more than the a-axis in a vertical direction to the surface of the film, can be formed.

Furthermore, since the formed film is irradiated with nitrogen plasma after the depositing step, the nitrogen defects in the film are reduced, resulting in a further improvement in heat resistance.

Thus, since, in the film type thermistor sensor 1 using the metal nitride material for a thermistor of the present embodiment, the thin film thermistor portion 3 made of the metal nitride material for a thermistor is formed on the insulating film 2, the insulating film 2 having low heat resistance, such as a resin film, can be used by the presence of the thin film thermistor portion 3 which is formed without firing and has a high B constant and high heat resistance, so that a thin and flexible thermistor sensor having an excellent thermistor characteristic is obtained.

A substrate material using a ceramics material such as alumina has often conventionally used. For example, if the substrate material is thinned to a thickness of 0.1 mm, the substrate material is very fragile and easily breakable. In the present invention, a film can be used, so that a very thin film type thermistor sensor having a thickness of 0.1 mm can be obtained.

EXAMPLES

Next, the evaluation results of Examples produced based on the above embodiment with regard to the metal nitride material for a thermistor according to the present invention, a method for producing the same, and a film type thermistor sensor will be specifically described with reference to FIGS. 4 to 12.

<Production of Film Evaluation Element>

Figure 4:
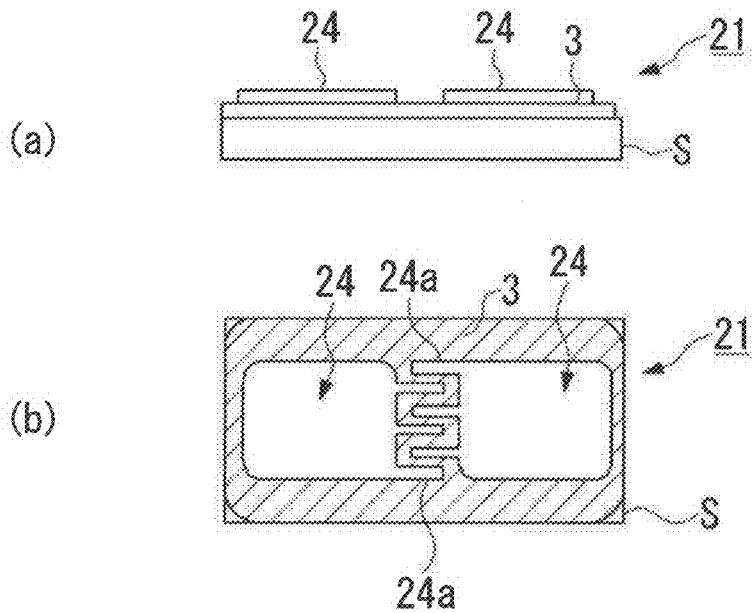
FIG. 4 is a front view and a plan view illustrating a film evaluation element for a metal nitride material for a thermistor according to Example of a metal nitride material for a thermistor, a method for producing the same, and a film type thermistor sensor of the present invention.

The film evaluation elements 21 shown in FIG. 4 were produced in Examples and Comparative Examples of the present invention.

Firstly, each of the thin film thermistor portions 3 having a thickness of 500 nm, which were made of the metal nitride materials for a thermistor formed with various composition ratios as shown in Table 1, was formed on an Si wafer with a thermal oxidation film as an Si substrate S by using Ti—Al alloy targets formed with various composition ratios in the reactive sputtering method. The thin film thermistor portions 3 were produced under the sputtering conditions of an ultimate degree of vacuum of $5\times10^{-6}$ Pa, a sputtering gas pressure of from 0.1 to 1 Pa, a target input power (output)

of from 100 to 500 W, and a nitrogen gas partial pressure under a mixed gas (Ar gas+nitrogen gas) atmosphere of from 10 to 100%.

Next, a Cr film having a thickness of 20 nm was formed and an Au film having a thickness of 200 nm was further formed on each of the thin film thermistor portions 3 by the sputtering method. Furthermore, a resist solution was coated on the stacked metal films using a spin coater, and then prebaking was performed for 1.5 minutes at a temperature of 110° C. After being exposed by an exposure device, an unnecessary portion was removed by a developing solution, and then pattering was performed by post baking for 5 minutes at a temperature of 150° C. Then, an unnecessary electrode portion was subject to wet etching using commercially available Au etchant and Cr etchant, and then the resist was stripped so as to form a pair of pattern electrodes 24 each having a desired comb shaped electrode portion 24a. Then, the resulting elements were diced into chip elements so as to obtain film evaluation elements 21 used for evaluating a B constant and for testing heat resistance.

Note that Comparative Examples in which the film evaluation elements 21 respectively have the composition ratios of $Ti_xAl_yN_z$ outside the range of the present invention and have different crystal systems were similarly produced for comparative evaluation.

<Film Evaluation>

(1) Composition Analysis

The elemental analysis for the thin film thermistor portions 3 obtained by the reactive sputtering method was performed by X-ray photoelectron spectroscopy (XPS). In the XPS, a quantitative analysis was performed for a sputtering surface up to a depth of 20 nm from the outermost surface by Ar sputtering. The results are shown in Table 1. In the following tables, the composition ratio is represented by "atomic %".

In the X-ray photoelectron spectroscopy (XPS), a quantitative analysis was performed under the conditions of an X-ray source of MgKα (350 W), a path energy of 58.5 eV, a measurement interval of 0.125 eV, a photo-electron take-off angle with respect to a sample surface of 45 deg, and an analysis area of about 800 μmϕ. For the quantification accuracy, the quantification accuracy of N/(Ti+Al+N) was ±2%, and the quantification accuracy of Al/(Ti+Al) was ±1%.

(2) Specific Resistance Measurement

The specific resistance of each of the thin film thermistor portions 3 obtained by the reactive sputtering method was measured by the four-probe method at a temperature of 25° C. The results are shown in Table 1.

(3) Measurement of B Constant

The resistance value for each of the film evaluation elements 21 at temperatures of 25° C. and 50° C. was measured in a constant temperature bath, and a B constant was calculated based on the resistance values at temperatures of 25° C. and 50° C. The results are shown in Table 1.

In the B constant calculating method of the present invention, the B constant is calculated by the following formula using the resistance values at temperatures of 25° C. and 50° C.

B constant (K)=ln(R25/R50)/(1/T25−1/T50)

R25 (Ω): resistance value at 25° C.

R50 (Ω): resistance value at 50° C.

T25 (K): 298.15 K which is absolute temperature of 25° C. expressed in Kelvin

T50 (K): 323.15 K which is absolute temperature of 50° C. expressed in Kelvin

Figure 1:
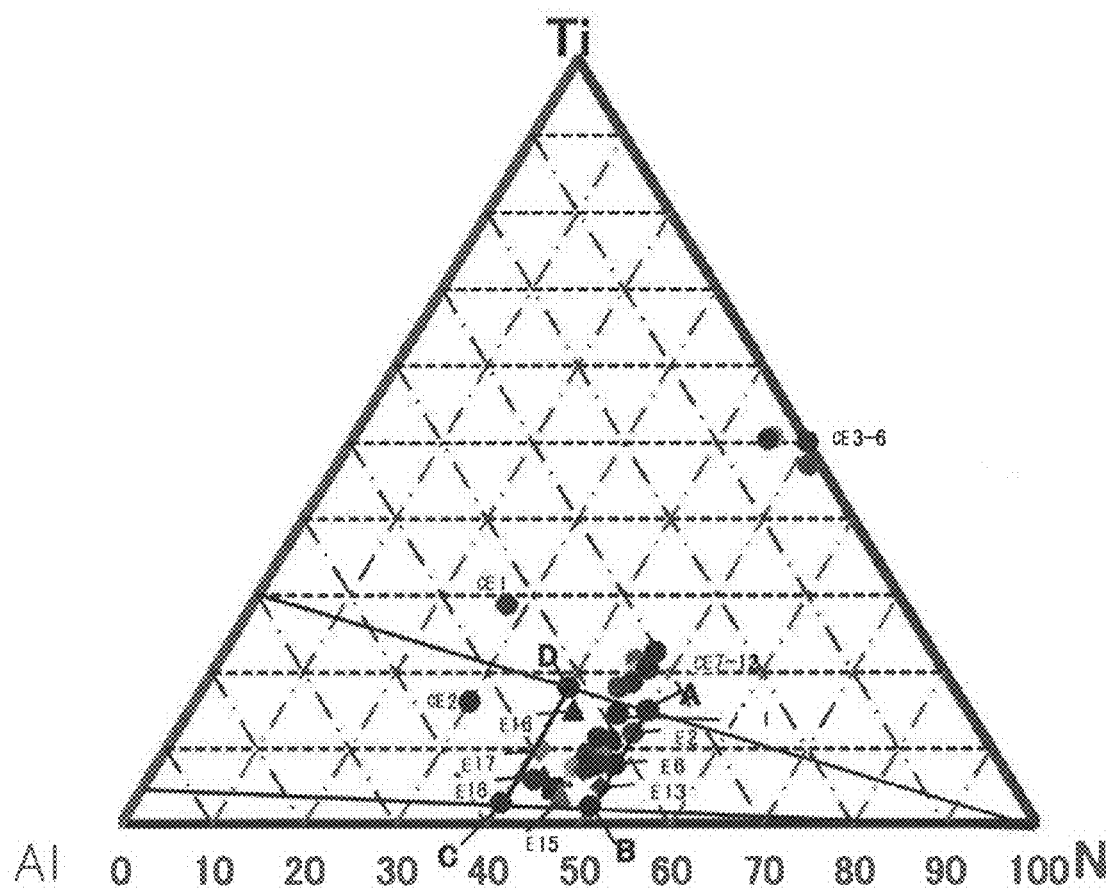
FIG. 1 is a Ti—Al—N-based ternary phase diagram illustrating the composition range of a metal nitride material for a thermistor according to one embodiment of a metal nitride material for a thermistor, a method for producing the same, and a film type thermistor sensor of the present invention.

As can be seen from these results, a thermistor characteristic having a resistivity of 100 Ωcm or greater and a B constant of 1500 K or greater is achieved in all Examples in which the composition ratio of $Ti_xAl_yN_z$ falls within the region enclosed by the points A, B, C, and D in the Ti—Al—N-based ternary phase diagram as shown in FIG. 1, i.e., the region where "0.70≤y/(x+y)≤0.95, 0.4≤z≤0.5, and x+y+z=1".

Figure 5:
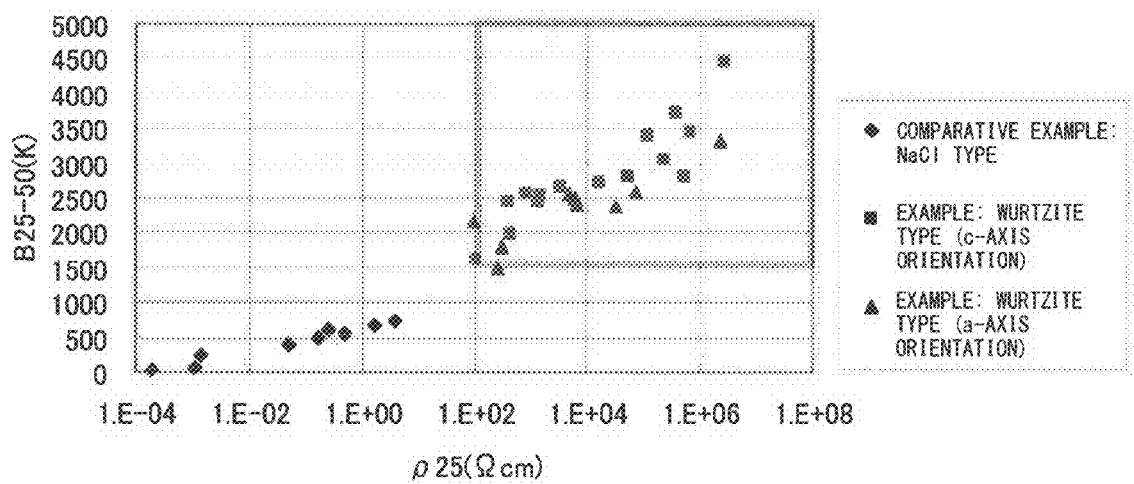
FIG. 5 is a graph illustrating the relationship between a resistivity at 25° C. and a B constant according to Example and Comparative Example of the present invention.
Figure 6:
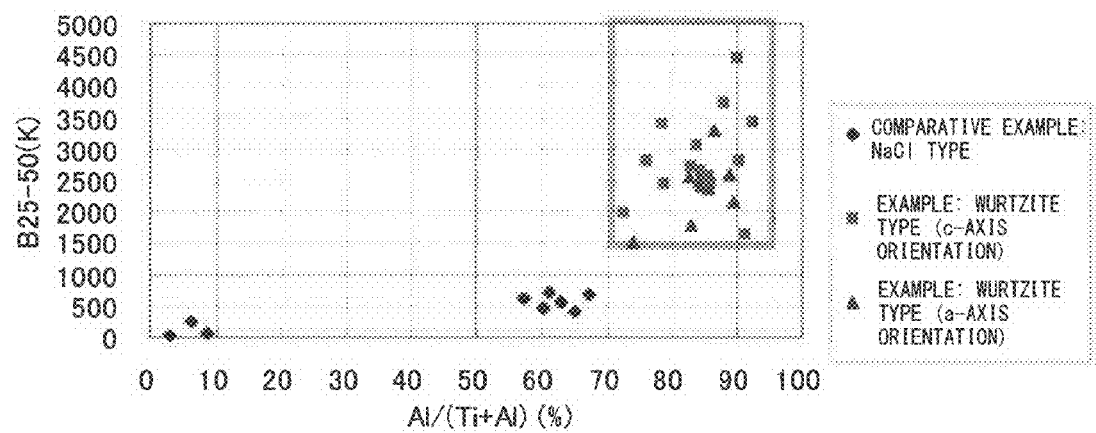
FIG. 6 is a graph illustrating the relationship between the Al/(Ti+Al) ratio and the B constant according to Example and Comparative Example of the present invention.

From the above results, a graph illustrating the relationship between a resistivity at 25° C. and a B constant is shown in FIG. 5. Also, a graph illustrating the relationship between the Al/(Ti+Al) ratio and the B constant is shown in FIG. 6. From these graphs, the film evaluation elements 21 which fall within the region where Al/(Ti+Al) is from 0.7 to 0.95 and N/(Ti+Al+N) is from 0.4 to 0.5 and the crystal system thereof is a hexagonal wurtzite-type single phase have a specific resistance value at a temperature of 25° C. of 100 Ωcm or greater and a B constant of 1500 K or greater, and thus, fall within the region of high resistance and high B constant. In data shown in FIG. 6, the reason why the B constant varies with respect to the same Al/(Ti+Al) ratio is because the film evaluation elements 21 have different amounts of nitrogen in their crystals.

Comparative Examples 3 to 12 shown in Table 1 fall within the region where Al/(Ti+Al)<0.7, and the crystal system thereof is a cubic NaCl-type phase. In Comparative Example 12 (Al/(Ti+Al)=0.67), a NaCl-type phase and a wurtzite-type phase coexist. Thus, the region where Al/(Ti+Al)<0.7 exhibits a specific resistance value at a temperature of 25° C. of less than 100 Ωcm and a B constant of less than 1500 K, and thus, is a region of low resistance and low B constant.

Comparative Examples 1 and 2 shown in Table 1 fall within the region where N/(Al+Ti+N) is less than 40%, and thus, are in a crystal state where nitridation of metals contained therein is insufficient. Comparative Examples 1 and 2 were neither a NaCl-type nor a wurtzite-type and had very poor crystallinity. In addition, it was found that Comparative Examples 1 and 2 exhibited near-metallic behavior because both the B constant and the resistance value were very small.

(4) Thin Film X-ray Diffraction (Identification of Crystal Phase)

The crystal phases of the thin film thermistor portions 3 obtained by the reactive sputtering method were identified by Grazing Incidence X-ray Diffraction. The thin film X-ray diffraction is a small angle X-ray diffraction experiment. Measurement was performed under the condition of a vessel of Cu, the angle of incidence of 1 degree, and 2θ of from 20 to 130 degrees. Some of the samples were measured under the condition of the angle of incidence of 0 degree and 2θ of from 20 to 100 degrees.

As a result of measurement, a wurtzite-type phase (hexagonal, the same phase as that of AlN) was obtained in the region where Al/(Ti+Al)≥0.7, whereas a NaCl-type phase (cubic, the same phase as that of TiN) was obtained in the region where Al/(Ti+Al)<0.65. A crystal phase in which a wurtzite-type phase and a NaCl-type phase coexisted was obtained in the region where 0.65<Al/(Ti+Al)<0.7.

Thus, in the Ti—Al—N-based metal nitride material, the region of high resistance and high B constant exists in the wurtzite-type phase where Al/(Ti+Al)≥0.7. In Examples of the present invention, no impurity phase was confirmed and the crystal structure thereof was a wurtzite-type single phase.

In Comparative Examples 1 and 2 shown in Table 1, the crystal phase thereof was neither a wurtzite-type phase nor a NaCl-type phase as described above, and thus, could not be identified in the testing. In these Comparative Examples, the peak width of XRD was very large, resulting in obtaining materials exhibiting very poor crystallinity. It is contemplated that the crystal phase thereof was a metal phase with insufficient nitridation because Comparative Examples 1 and 2 exhibited near-metallic behavior from the viewpoint of electric characteristics.

orientation to the crystal axis in a vertical direction (film, thickness direction) to the Si substrate S was examined by XRD. At this time, in order to examine the orientation of crystal axis, the peak intensity ratio of (100)/(002) was measured, where (100) is the hkl index indicating a-axis orientation and (002) is the hkl index indicating c-axis orientation.

TABLE 1

| | CRYSTAL SYSTEM | XRD PEAK INTENSITY RATIO OF (100)/(002) WHEN CRYSTAL PHASE IS WURTZITE TYPE PHASE | CRYSTAL AXIS EXHIBITING STRONG DEGREE OF ORIENTATION IN VERTICAL DIRECTION TO SUBSTRATE SURFACE WHEN CRYSTAL PHASE IS WURTZITE TYPE PHASE (a-AXIS OR c-AXIS) | SPUTTERING GAS PRESSURE (Pa) | COMPOSITION RATIO | | | | RESULT OF ELECTRIC PROPERTIES | |
|---|---|---|---|---|---|---|---|---|---|---|
| | | | | | Ti (%) | Al (%) | N (%) | Al/(Ti + Al) (%) | B CONSTANT (K) | SPECIFIC RESISTANCE VALUE AT 25° C. (Ωcm) |
| COMPARATIVE EXAMPLE 1 | UNKOWN (INSUFFICIENT NITRIDATION) | — | | — | 29 | 43 | 28 | 60 | <0 | 2.E−04 |
| COMPARATIVE EXAMPLE 2 | UNKNOWN (INSUFFICIENT NITRIDATION) | — | | — | 16 | 54 | 30 | 77 | 25 | 2.E−04 |
| COMPARATIVE EXAMPLE 3 | NaCl TYPE | — | | — | 50 | 0 | 50 | 0 | <0 | 2.E−05 |
| COMPARATIVE EXAMPLE 4 | NaCl TYPE | — | | — | 47 | 1 | 52 | 3 | 30 | 2.E−04 |
| COMPARATIVE EXAMPLE 5 | NaCl TYPE | — | | — | 51 | 3 | 46 | 6 | 248 | 1.E−03 |
| COMPARATIVE EXAMPLE 6 | NaCl TYPE | — | | — | 50 | 5 | 45 | 9 | 69 | 1.E−03 |
| COMPARATIVE EXAMPLE 7 | NaCl TYPE | — | | — | 23 | 30 | 47 | 57 | 622 | 3.E−01 |
| COMPARATIVE EXAMPLE 8 | NaCl TYPE | — | | — | 22 | 33 | 45 | 60 | 477 | 2.E−01 |
| COMPARATIVE EXAMPLE 9 | NaCl TYPE | — | | — | 21 | 32 | 47 | 61 | 724 | 4.E+00 |
| COMPARATIVE EXAMPLE 10 | NaCl TYPE | — | | — | 20 | 34 | 46 | 63 | 564 | 5.E−01 |
| COMPARATIVE EXAMPLE 11 | NaCl TYPE | — | | — | 19 | 35 | 46 | 65 | 402 | 5.E−02 |
| COMPARATIVE EXAMPLE 12 | NaCl TYPE + WURTZITE TYPE | — | | — | 18 | 37 | 45 | 67 | 685 | 2.E+00 |
| EXAMPLE 1 | WURTZITE TYPE | 0.05 | c-AXIS | <0.67 | 15 | 38 | 47 | 72 | 1980 | 4.E+02 |
| EXAMPLE 2 | WURTZITE TYPE | 0.07 | c-AXIS | <0.67 | 12 | 38 | 50 | 76 | 2798 | 6.E+04 |
| EXAMPLE 3 | WURTZITE TYPE | 0.45 | c-AXIS | <0.67 | 11 | 42 | 47 | 79 | 3385 | 1.E+05 |
| EXAMPLE 4 | WURTZITE TYPE | <0.01 | c-AXIS | <0.67 | 11 | 41 | 48 | 79 | 2437 | 4.E+02 |
| EXAMPLE 5 | WURTZITE TYPE | 0.34 | c-AXIS | <0.67 | 9 | 43 | 48 | 83 | 2727 | 2.E+04 |
| EXAMPLE 6 | WURTZITE TYPE | <0.01 | c-AXIS | <0.67 | 8 | 42 | 50 | 84 | 3057 | 2.E+05 |
| EXAMPLE 7 | WURTZITE TYPE | 0.09 | c-AXIS | <0.67 | 8 | 44 | 48 | 84 | 2685 | 3.E+03 |
| EXAMPLE 8 | WURTZITE TYPE | 0.05 | c-AXIS | <0.67 | 8 | 44 | 48 | 85 | 2527 | 1.E+03 |
| EXAMPLE 9 | WURTZITE TYPE | <0.01 | c-AXIS | <0.67 | 8 | 45 | 47 | 88 | 2557 | 8.E+02 |
| EXAMPLE 10 | WURTZITE TYPE | 0.04 | c-AXIS | <0.67 | 7 | 46 | 46 | 86 | 2449 | 1.E+03 |
| EXAMPLE 11 | WURTZITE TYPE | 0.24 | c-AXIS | <0.67 | 7 | 48 | 45 | 88 | 3729 | 4.E+05 |
| EXAMPLE 12 | WURTZITE TYPE | 0.73 | c-AXIS | <0.67 | 5 | 49 | 46 | 90 | 2798 | 5.E+05 |
| EXAMPLE 13 | WURTZITE TYPE | <0.01 | c-AXIS | <0.67 | 5 | 45 | 50 | 90 | 4449 | 3.E+06 |
| EXAMPLE 14 | WURTZITE TYPE | 0.38 | c-AXIS | <0.67 | 5 | 50 | 45 | 91 | 1621 | 1.E+02 |
| EXAMPLE 15 | WURTZITE TYPE | 0.13 | c-AXIS | <0.67 | 4 | 50 | 46 | 93 | 3439 | 6.E+05 |
| EXAMPLE 16 | WURTZITE TYPE | 3.54 | a-AXIS | ≥0.67 | 15 | 43 | 42 | 74 | 1507 | 3.E+02 |
| EXAMPLE 17 | WURTZITE TYPE | 2.94 | a-AXIS | ≥0.67 | 10 | 49 | 41 | 83 | 1794 | 3.E+02 |
| EXAMPLE 18 | WURTZITE TYPE | 1.05 | a-AXIS | ≥0.67 | 6 | 52 | 42 | 90 | 2164 | 1.E+02 |
| EXAMPLE 19 | WURTZITE TYPE | 2.50 | a-AXIS | ≥0.67 | 9 | 44 | 47 | 83 | 2571 | 5.E+03 |
| EXAMPLE 20 | WURTZITE TYPE | 9.09 | a-AXIS | ≥0.67 | 8 | 46 | 46 | 84 | 2501 | 6.E+03 |
| EXAMPLE 21 | WURTZITE TYPE | 6.67 | a-AXIS | ≥0.67 | 8 | 45 | 47 | 84 | 2408 | 7.E+03 |
| EXAMPLE 22 | WURTZITE TYPE | 2.22 | a-AXIS | ≥0.67 | 8 | 46 | 46 | 86 | 2364 | 3.E+04 |
| EXAMPLE 23 | WURTZITE TYPE | 1.21 | a-AXIS | ≥0.67 | 7 | 46 | 47 | 87 | 3317 | 2.E+08 |
| EXAMPLE 24 | WURTZITE TYPE | 3.33 | a-AXIS | ≥0.67 | 6 | 51 | 43 | 89 | 2599 | 7.E+04 |

Next, all of Examples in the present invention were wurtzite-type phase films having strong orientation. Thus, whether the films have strong a-axis orientation or c-axis Consequently, in Examples in which film deposition was performed at a sputtering gas pressure of less than 0.67 Pa, the intensity of (002) was much stronger than that of (100), so that the films exhibited stronger c-axis orientation than a-axis orientation. On the other hand, in Examples in which film deposition was performed at a sputtering gas pressure of 0.67 Pa or greater, the intensity of (100) was much stronger than that of (002), so that the films exhibited stronger a-axis orientation than c-axis orientation.

Note that it was confirmed that a wurtzite-type single phase was formed in the same manner even when the thin film thermistor portion 3 was deposited on a polyimide film under the same deposition condition. In addition, it was confirmed that the crystal orientation did not change even when the thin film thermistor portion 3 was deposited on a polyimide film under the same deposition condition.

Figure 7:
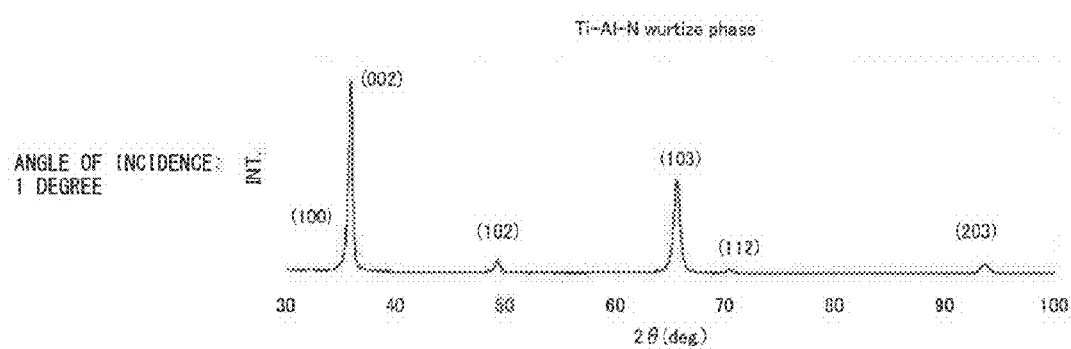
FIG. 7 is a graph illustrating the result of X-ray diffraction (XRD) in the case of a strong c-axis orientation where Al/(Ti+Al)=0.84 according to Example of the present invention.

An exemplary XRD profile in Example exhibiting strong c-axis orientation is shown in FIG. 7. In this Example, Al/(Ti+Al) was equal to 0.84 (wurtzite-type, hexagonal), and measurement was performed at the angle of incidence of 1 degree. As can be seen from the result in this Example, the intensity of (002) was much stronger than that of (100).

Figure 8:
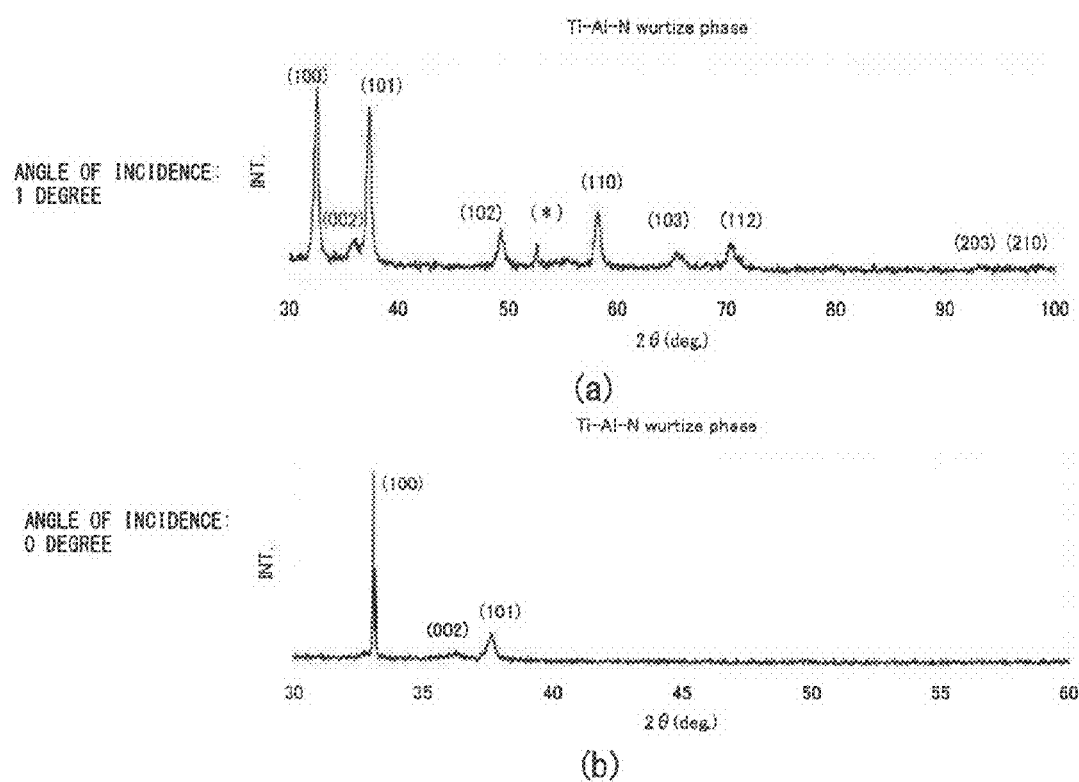
FIG. 8 is a graph illustrating the result of X-ray diffraction (XRD) in the case of a strong a-axis orientation where Al/(Ti+Al)=0.83 according to Example of the present invention.

An exemplary XRD profile in Example exhibiting strong a-axis orientation is shown in FIG. 8. In this Example, Al/(Ti+Al) was equal to 0.83 (wurtzite-type, hexagonal), measurement was performed at the angle of incidence of 1 degree. As can be seen from the result in this Example, the intensity of (100) was much stronger than that of (002).

Furthermore, in this Example, symmetrical measurement was performed at the angle of incidence of 0 degrees The asterisk (*) in the graph was a peak originating from the XRD device, and thus, it was confirmed that the asterisk (*) in the graph is neither a peak originating from the sample itself nor a peak originating from the impurity phase (it can be seen from that fact that the peak indicated by (*) is lost in the symmetrical measurement, and thus, it is a peak originating from the device.

Figure 9:
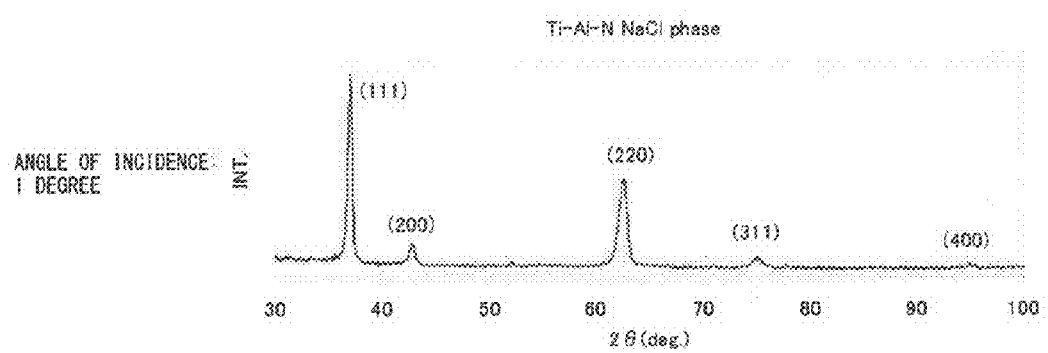
FIG. 9 is a graph illustrating the result of X-ray diffraction (XRD) in the case where Al/(Ti+Al)=0.60 according to Comparative Example of the present invention.

An exemplary XRD profile in Comparative Example is shown in FIG. 9. In this Comparative Example, Al/(Ti+Al) was equal to 0.6 (NaCl type, cubic), and measurement was performed at the angle of incidence of 1 degree. No peak which could be indexed as a wurtzite-type (space group P6₃mc (No. 186)) was detected, and thus, this Comparative Example was confirmed as a NaCl-type single phase.

Next, the correlation between a crystal structure and its electric characteristic was compared in detail with each other with regard to Examples of the present invention in which the wurtzite-type materials were employed.

Figure 10:
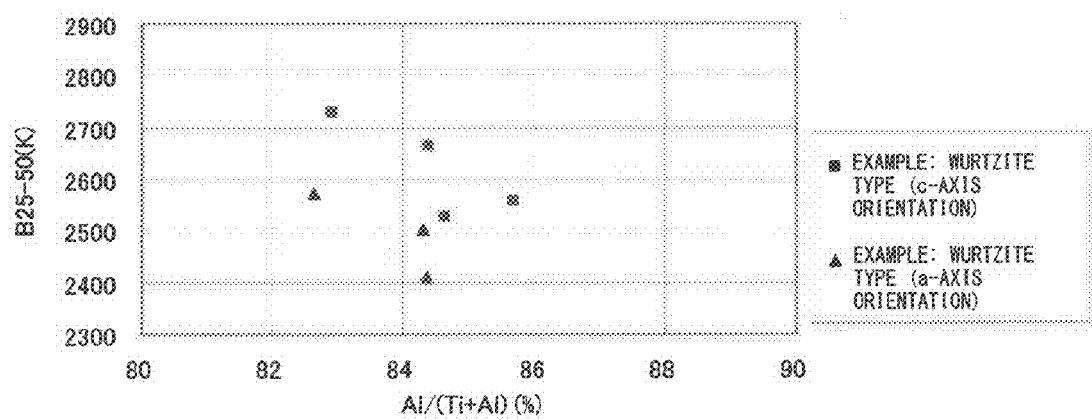
FIG. 10 is a graph illustrating the relationship between the Al/(Ti+Al) ratio and the B constant obtained by comparing Example revealing a strong a-axis orientation and Example revealing a strong c-axis orientation according to Examples of the present invention.

As shown in Table 2 and FIG. 10, there were materials (Examples 7, 9, 10, and 11) of which the crystal axis is strongly oriented along a c-axis in a vertical direction to the surface of the substrate and materials (Examples 19, 20, and 21) of which the crystal axis is strongly oriented along an a-axis in a vertical direction to the surface of the substrate despite the fact that they have substantially the same Al/(Ti+Al) ratio.

When both groups were compared to each other, it was found that the materials having a strong c-axis orientation had a greater B constant by about 100 K than that of the materials having a strong a-axis orientation upon, the same Al/(Ti+Al) ratio. When focus was placed on the amount of N (N/(Ti+Al+N)), it was found that the materials having a strong c-axis orientation had a slightly larger amount of nitrogen than that of the materials having a strong a-axis orientation. Since the ideal stoichiometric ratio of N/(Ti+Al+N) is 0.5, it was found that the materials having a strong c-axis orientation were ideal materials due to a small amount of nitrogen defects.

TABLE 2

| | CRYSTAL SYSTEM | XRD PEAK INTENSITY RATIO OF (100)/(002) WHEN CRYSTAL PHASE IS WURTZITE TYPE PHASE | CRYSTAL AXIS EXHIBITING STRONG DEGREE OF ORIENTATION IN VERTICAL DIRECTION TO SUBSTRATE SURFACE WHEN CRYSTAL PHASE IS WURTZITE TYPE PHASE (a-AXIS OR c-AXIS) | SPUT- TERING GAS PRES- SURE (Pa) | COMPOSITION RATIO | | | | RESULT OF ELECTRIC PROPERTIES | |
|---|---|---|---|---|---|---|---|---|---|---|
| | | | | | Ti(%) | Al(%) | N(%) | Al/(Ti+Al) (%) | B CON- STANT (K) | SPECIFIC RESISTANCE VALUE AT 25° C. (Ω cm) |
| EXAMPLE 5 | WURTZITE TYPE | 0.34 | c-AXIS | <0.67 | 9 | 43 | 48 | 83 | 2727 | 2.E+04 |
| EXAMPLE 7 | WURTZITE TYPE | 0.09 | c-AXIS | <0.67 | 8 | 44 | 48 | 84 | 2665 | 3.E+03 |
| EXAMPLE 8 | WURTZITE TYPE | 0.05 | c-AXIS | <0.67 | 8 | 44 | 48 | 85 | 2527 | 1.E+03 |
| EXAMPLE 9 | WURTZITE TYPE | <0.01 | c-AXIS | <0.67 | 8 | 45 | 47 | 86 | 2557 | 8.E+02 |
| EXAMPLE 19 | WURTZITE TYPE | 2.50 | a-AXIS | ≥0.67 | 9 | 44 | 47 | 83 | 2571 | 5.E+03 |
| EXAMPLE 20 | WURTZITE TYPE | 9.09 | a-AXIS | ≥0.67 | 8 | 46 | 46 | 84 | 2501 | 6.E+03 |
| EXAMPLE 21 | WURTZITE TYPE | 6.67 | a-AXIS | ≥0.67 | 8 | 45 | 47 | 84 | 2408 | 7.E+03 |

<Crystal Form Evaluation>

Figure 11:
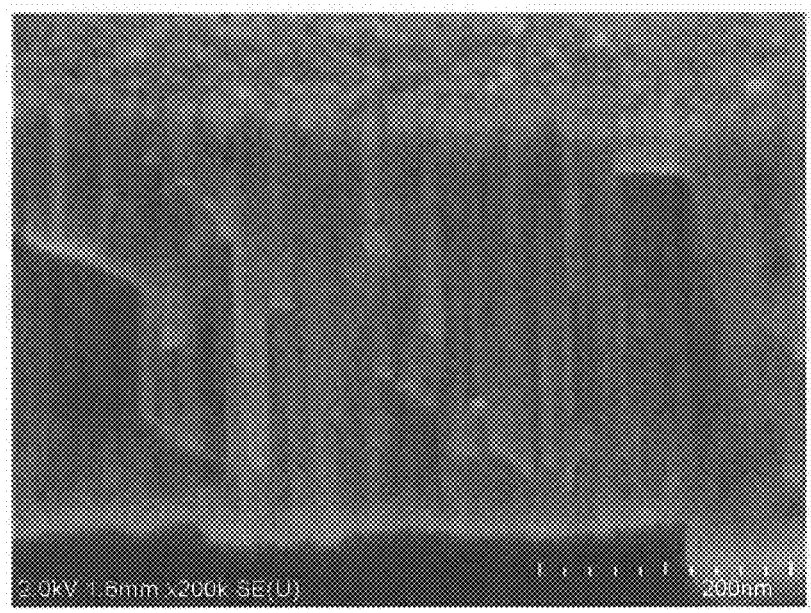
FIG. 11 is a cross-sectional SEM photograph illustrating Example revealing a strong c-axis orientation according to Example of the present invention.
Figure 12:
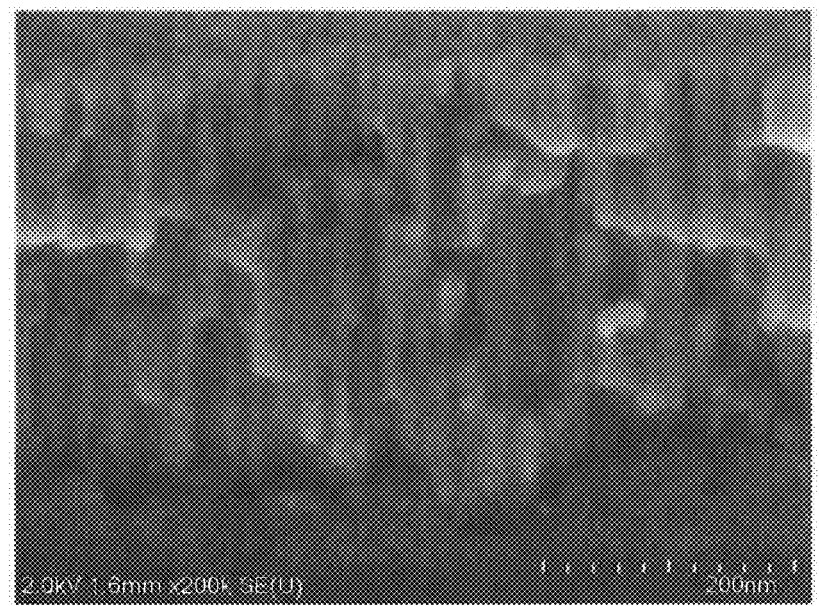
FIG. 12 is a cross-sectional SEM photograph illustrating Example revealing a strong a-axis orientation according to Example of the present invention.

Next, as an exemplary crystal form in the cross-section of the thin film thermistor portion 3, a cross-sectional SEM photograph of the thin film thermistor portion 3 in Example (Al/(Ti+Al)=0.84, wurtzite-type, hexagonal, and strong c-axis orientation) in which the thin film thermistor portion 3 was deposited on the Si substrate S with a thermal oxidation film is shown in FIG. 11. Also, a cross-sectional SEM photograph of the thin film thermistor portion 3 in another Example (Al/(Ti+Al)=0.83, wurtzite-type, hexagonal, and strong a-axis orientation) is shown in FIG. 12.

The samples in these Examples were obtained by breaking the Si substrates S by cleaving them. The photographs were taken by tilt observation at the angle of 45 degrees.

As can be seen from these photographs, samples were formed of a high-density columnar crystal in both Examples. Specifically, the growth of columnar crystal in a direction perpendicular to the surface of the substrate was observed in Example revealing a strong c-axis orientation and another Example revealing a strong a-axis orientation. Note that the break of the columnar crystal was generated upon breaking the Si substrate S by cleaving it.

<Heat Resistance Test Evaluation>

In Examples and Comparative Example shown in Table 3, a resistance value and a B constant before and after the heat resistance test at a temperature of 125° C. for 1000 hours in air were evaluated. The results are shown in Table 3. Comparative Example made by a conventional Ta—Al—N-based material was also evaluated in the same manner for comparison.

As can be seen from these results, although the Al concentration and the nitrogen concentration vary, the heat resistance of the Ti—Al—N-based material based on the electric characteristic change before and after the heat resistance test is better than the Ta—Al—N-based material in Comparative Example when comparison is made by using the same B constant. Note that the materials used in Examples 5 and 8 have a strong c-axis orientation and the materials used in Examples 21 and 28 have a strong a-axis orientation. When both groups were compared to each other, the heat resistance of Examples revealing a strong c-axis orientation is slightly improved as compared with that of Examples revealing a strong a-axis orientation.

Note that, in the Ta—Al—N-based material, ionic radius of Ta is very high compared to that of Ti and Al, and thus, a wurtzite-type phase cannot be produced in the high-concentration Al region. It is contemplated that the Ti—Al—N-based material having the wurtzite-type phase has better heat resistance than the Ta—Al—N-based material because the Ta—Al—N-based material is not the wurtzite-type phase.

TABLE 4

| NITROGEN PLASMA IRRADIATION | RISING RATE OF SPECIFIC RESISTANCE AT 25° C. AFTER HEAT RESISTANCE TEST AT 125° C. FOR 1,000 HOURS (%) | RISING RATE OF B CONSTANT AFTER HEAT RESISTANCE TEST AT 125° C. FOR 1,000 HOURS (%) |
| --- | --- | --- |
| YES | <2 | <1 |
| NO (EXAMPLE 5) | <4 | <1 |

It can be seen from the above evaluation that a metal nitride material may exhibit an excellent thermistor characteristic when it is produced in a ratio of N/(Ti+Al+N) from 0.4 to 0.5. However, a stoichiometric ratio of N/(Ti+Al+N) is 0.5. Hence, it is found that the nitrogen defects are present in the material because the amount of nitrogen is less than 0.5 in this test. It is preferable to add a process for compensating the nitrogen defects, and one preferred example thereof is irradiation with nitrogen plasma.

The technical scope of the present invention is not limited to the aforementioned embodiments and Examples, but the present invention may be modified in various ways without departing from the scope or teaching of the present invention.

TABLE 3

| | M ELEMENT | M(%) | Al(%) | N(%) | Al/(M + Al) (%) | B25-50 (K) | SPECIFIC RESISTANCE VALUE AT 25° C. (Ω cm) | RISING RATE OF SPECIFIC RESISTANCE AT 25° C. AFTER HEAT RESISTANCE TEST AT 125° C. FOR 1,000 HOURS (%) | RISING RATE OF B CONSTANT AFTER HEAT RESISTANCE TEST AT 125° C. FOR 1,000 HOURS (%) |
| --- | --- | --- | --- | --- | --- | --- | --- | --- | --- |
| COMPARATIVE EXAMPLE | Ta | 60 | 1 | 39 | 2 | 2671 | 5.E+02 | 25 | 16 |
| EXAMPLE 5 | Ti | 9 | 43 | 48 | 83 | 2727 | 2.E+04 | <4 | <1 |
| EXAMPLE 8 | Ti | 8 | 44 | 48 | 85 | 2527 | 1.E+03 | <4 | <1 |
| EXAMPLE 21 | Ti | 8 | 45 | 47 | 84 | 2408 | 7.E+03 | <5 | <1 |
| EXAMPLE 24 | Ti | 6 | 51 | 43 | 89 | 2599 | 7.E+04 | <5 | <1 |

<Heat Resistance Evaluation by Irradiation of Nitrogen Plasma>

After the thin film thermistor portion 3 in Example 5 shown in Table 1 was deposited on the insulating film 2, the resulting film was irradiated with nitrogen plasma under the degree of vacuum of 6.7 Pa, the output of 200 W, and the $N_2$ gas atmosphere. The results obtained by the heat resistance tests of a film evaluation element 21 with irradiation with nitrogen plasma and another film evaluation element 21 without irradiation with nitrogen plasma are shown in Table 4. As can be seen from the result, in Example with irradiation with nitrogen plasma, the change in specific resistance and B constant is small, resulting in an improvement in heat resistance of the film. This is because the crystallinity is improved by reduction in nitrogen defects in the film by nitrogen plasma. It is more preferable that nitrogen plasma is radical nitrogen.

REFERENCE NUMERALS

1: film type thermistor sensor, 2: insulating film, 3: thin film thermistor portion, 4 and 24: pattern electrode.

What is claimed is:

1. A thermistor made of a metal nitride material, the metal nitride material consisting of a metal nitride represented by the general formula: TixAlyNz (where 0.70≤y/(x+y)≤0.95, 0.4≤z≤0.5, and x+y+z=1), wherein the crystal structure thereof is a hexagonal wurtzite-type single phase, wherein the rising rate of specific resistance at 25° C. after heat resistance test at 125° C. for 1,000 hours is less than 5%.

2. The thermistor according to claim 1, wherein the metal nitride material is deposited as a film and is a columnar crystal extending in a vertical direction to a surface of the film.

3. The thermistor according to claim 1, wherein the metal nitride material is deposited as a film and is strongly oriented along a c-axis more than an a-axis in a vertical direction to a surface of the film.

4. A film type thermistor sensor comprising:
an insulating film;
a thin film thermistor portion made of the metal nitride material according to claim 1 on the insulating film; and
a pair of pattern electrodes formed at least on the top or the bottom of the thin film thermistor portion.

5. A method for producing the thermistor according to claim 1, the method comprising:
a depositing step of performing film deposition by reactive sputtering in a nitrogen-containing atmosphere using a Ti-Al alloy sputtering target.

6. The method for producing the thermistor according to claim 5, wherein a sputtering gas pressure during the reactive sputtering is set to less than 0.67 Pa.

7. The method for producing the thermistor according to claim 5, the method comprising:
a step of irradiating the formed film with nitrogen plasma after the depositing step.

8. A thermistor made of a metal nitride material, the metal nitride material consisting of a metal nitride represented by the general formula: $Ti_xAl_yN_z$ (where $0.70 \leq y/(x+y) \leq 0.95$, $0.4 \leq z \leq 0.5$, and $x+y+z=1$), wherein the crystal structure thereof is a hexagonal wurtzite-type single phase, wherein the B constant thereof calculated based on resistance values at temperatures of 25° C. and 50° C. is 1500 K or greater.

9. The thermistor according to claim 8, wherein the metal nitride material is deposited as a film and is a columnar crystal extending in a vertical direction to a surface of the film.

10. The thermistor according to claim 8, wherein the metal nitride material is deposited as a film and is strongly oriented along a c-axis more than an a-axis in a vertical direction to a surface of the film.

11. A film type thermistor sensor comprising:
an insulating film;
a thin film thermistor portion made of the metal nitride material according to claim 8 on the insulating film; and
a pair of pattern electrodes formed at least on the top or the bottom of the thin film thermistor portion.

12. A thermistor made of a metal nitride material, the metal nitride material consisting of a metal nitride represented by the general formula: $Ti_xAl_yN_z$ (where $0.70 \leq y/(x+y) \leq 0.95$, $0.4 \leq z \leq 0.5$, and $x+y+z=1$), wherein the crystal structure thereof is a hexagonal wurtzite-type single phase, wherein the specific resistivity value thereof is 100 Ωcm or greater.

13. The thermistor according to claim 12, wherein the metal nitride material is deposited as a film and is a columnar crystal extending in a vertical direction to a surface of the film.

14. The thermistor according to claim 12, wherein the metal nitride material is deposited as a film and is strongly oriented along a c-axis more than an a-axis in a vertical direction to a surface of the film.

15. A film type thermistor sensor comprising:
an insulating film;
a thin film thermistor portion made of the metal nitride material according to claim 12 on the insulating film; and
a pair of pattern electrodes formed at least on the top or the bottom of the thin film thermistor portion.

* * * * *